United States Patent
Yalamanchili et al.

(10) Patent No.: US 8,598,016 B2
(45) Date of Patent: Dec. 3, 2013

(54) IN-SITU DEPOSITED MASK LAYER FOR DEVICE SINGULATION BY LASER SCRIBING AND PLASMA ETCH

(75) Inventors: Madhava Rao Yalamanchili, Morgan Hill, CA (US); Wei-Sheng Lei, San Jose, CA (US); Brad Eaton, Menlo Park, CA (US); Saravjeet Singh, Santa Clara, CA (US); Ajay Kumar, Cupertino, CA (US); Banqiu Wu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 99 days.

(21) Appl. No.: 13/160,973

(22) Filed: Jun. 15, 2011

(65) Prior Publication Data

US 2012/0322234 A1   Dec. 20, 2012

(51) Int. Cl.
*H01L 21/00* (2006.01)
(52) U.S. Cl.
USPC .................................. 438/462; 257/E21.602
(58) Field of Classification Search
USPC .................................. 438/694–696, 700–702
See application file for complete search history.

(56) References Cited

U.S. PATENT DOCUMENTS

| | | | |
|---|---|---|---|
| 4,049,944 A | 9/1977 | Garvin et al. | |
| 4,684,437 A * | 8/1987 | Donelon et al. | 216/66 |
| 5,593,606 A | 1/1997 | Owen et al. | |
| 5,691,794 A * | 11/1997 | Hoshi et al. | 349/158 |
| 6,051,503 A * | 4/2000 | Bhardwaj et al. | 438/705 |
| 6,057,180 A | 5/2000 | Sun et al. | |
| 6,117,347 A | 9/2000 | Ishida | |
| 6,174,271 B1 | 1/2001 | Kosmowski | |
| 6,306,731 B1 | 10/2001 | Igarashi et al. | |
| 6,407,363 B2 | 6/2002 | Dunsky et al. | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, et al., "Water-Soluble Sacrificial Layers for Surface Micromachining", www.small-journal.com, 2005, 1, No. 7, 7 Pages.

(Continued)

*Primary Examiner* — Leonard Chang
(74) *Attorney, Agent, or Firm* — Blakely, Sokoloff, Taylor & Zafman LLP

(57) ABSTRACT

Methods of dicing substrates by both laser scribing and plasma etching. A method includes forming an in-situ mask with a plasma etch chamber by accumulating a thickness of plasma deposited polymer to protect IC bump surfaces from a subsequent plasma etch. Second mask materials, such as a water soluble mask material may be utilized along with the plasma deposited polymer. At least some portion of the mask is patterned with a femtosecond laser scribing process to provide a patterned mask with trenches. The patterning exposing regions of the substrate between the ICs in which the substrate is plasma etched to singulate the IC and the water soluble material layer washed off.

29 Claims, 11 Drawing Sheets

(56) References Cited

U.S. PATENT DOCUMENTS

| | | | |
|---|---|---|---|
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 2001/0035401 A1 | 11/2001 | Manor | |
| 2002/0012345 A1 | 1/2002 | Kalkunte et al. | |
| 2002/0042189 A1 | 4/2002 | Tanaka | |
| 2003/0045101 A1 | 3/2003 | Flanner et al. | |
| 2003/0152756 A1 | 8/2003 | Yamada et al. | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1* | 8/2004 | Xu et al. | 438/694 |
| 2004/0212047 A1* | 10/2004 | Joshi et al. | 257/620 |
| 2004/0259329 A1 | 12/2004 | Boyle et al. | |
| 2006/0024924 A1 | 2/2006 | Haji et al. | |
| 2006/0043535 A1 | 3/2006 | Hiatt | |
| 2006/0205182 A1 | 9/2006 | Soejima | |
| 2007/0272555 A1 | 11/2007 | Baird | |
| 2007/0272666 A1 | 11/2007 | O'Brien et al. | |
| 2008/0283848 A1 | 11/2008 | Yamazaki | |
| 2009/0176375 A1 | 7/2009 | Benson et al. | |
| 2009/0255911 A1 | 10/2009 | Krishnaswami et al. | |
| 2009/0321748 A1 | 12/2009 | Lee | |
| 2010/0025387 A1 | 2/2010 | Arai et al. | |
| 2010/0048001 A1 | 2/2010 | Harikai et al. | |
| 2010/0120227 A1 | 5/2010 | Grivna et al. | |
| 2010/0120230 A1 | 5/2010 | Grivna et al. | |
| 2010/0246611 A1 | 9/2010 | Sun | |
| 2011/0029124 A1 | 2/2011 | Boyle et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007281526 | 10/2007 |
| JP | 2009034694 | 2/2009 |
| JP | 2010165963 | 7/2010 |
| KR | 20100020727 | 2/2010 |
| WO | WO-03036712 | 5/2003 |
| WO | WO-03071591 | 5/2003 |
| WO | WO-2011163149 | 12/2011 |
| WO | WO-2012173758 | 12/2012 |
| WO | WO-2012173759 | 12/2012 |
| WO | WO-2012173768 | 12/2012 |
| WO | WO-2012173770 | 12/2012 |

OTHER PUBLICATIONS

Singh, et al., "Apparatus and Methods for Dry Etch With Edge, Side and Back Protection", U.S. Appl. No. 61/491,693, filed May 31, 2011 24 pgs.

Restriction Requirement for U.S. Appl. No. 13/180,336 dated Sep. 11, 2012, 6 pages.

International Search Report and Written Opinion from PCT/US2012/040303 mailed Dec. 28, 2012, 9 pgs.

Restriction Requirement for U.S. Appl. No. 13/161,006 Mailed Jan. 10, 2013, 6 Pages.

International Search Report and Written Opinion for PCT Patent Application No. PCT/US2012/040295 Mailed Dec. 27, 2012, 11 Pages.

Restriction Requirement for U.S. Appl. No. 13/161,026 Mailed Jan. 17, 2013, 6 Pages.

International Search Report and Written Opinion from PCT/US2012/040307 mailed Dec. 28, 2012, 9 pgs.

International Search Report and Written Opinion for PCT Patent Application No. PCT/US2012/039746 Mailed Dec. 26, 2012, 10 Pages.

Restriction Requirement for U.S. Appl. No. 13/161,036 Mailed Feb. 1, 2013, 6 Pages.

International Search Report and Written Opinion for PCT Patent Application No. PCT/US2012/039207 Mailed Dec. 26, 2012, 12 Pages.

International Search Report and Written Opinion for PCT Patent Application No. PCT/US2012/039209 Mailed Dec. 26, 2012, 8 Pages.

International Search Report and Written Opinion for PCT Patent Application No. PCT/US2012/039205 Mailed Dec. 26, 2012, 11 Pages.

International Search Report and Written Opinion for PCT Patent Application No. PCT/US2012/039753 Mailed Dec. 26, 2012, 9 Pages.

International Search Report and Written Opinion for PCT Patent Application No. PCT/US2012/040289 Mailed Jan. 2, 2013, 11 Pages.

International Search Report and Written Opinion for PCT Patent Application No. PCT/US2011/041126 Mailed Feb. 21, 2012, 10 Pages.

International Preliminary Report on Patentability for PCT Patent Application No. PCT/US2011/041126 Mailed Jan. 10, 2013, 7 Pages.

Restriction Requirement for U.S. Appl. No. 13/161,045 Mailed Feb. 19, 2013, 5 Pages.

Van Borkulo, Jeroen et al., "Enabling Technology in Thin Wafer Dicing", The Electrochemical Society, vol. 18, Issue 1, Packaging Technology, 2009, pp. 837-842.

Non-Final Office Action for U.S. Appl. No. 13/180,336 Mailed Feb. 6, 2013, 15 Pages.

* cited by examiner

IN-SITU DEPOSITED MASK LAYER FOR DEVICE SINGULATION BY LASER SCRIBING AND PLASMA ETCH

TECHNICAL FIELD

Embodiments of the present invention pertain to the field of semiconductor processing and, in particular, to masking methods for dicing substrates, each substrate having an integrated circuit (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting or insulating are utilized to form the ICs. These materials are doped, deposited and etched using various well-known processes to simultaneously form a plurality of ICs, such as memory devices, logic devices, photovoltaic devices, etc, in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the streets. For thin substrate singulation, such as 50-150 μms (μm) thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered metals (e.g., copper) in dicing along streets can create production issues or throughput limits. Finally, masking of the plasma dicing process may be problematic, depending on, inter alia, the thickness and top surface topography of the substrate, the selectivity of the plasma etch, and the materials present on the top surface of the substrate.

SUMMARY

Embodiments of the present invention include methods of masking semiconductor substrates for a hybrid dicing process including both laser scribing and plasma etching.

In an embodiment, a method of dicing a semiconductor substrate having a plurality of ICs includes forming a mask over the semiconductor substrate, the mask including a plasma deposited material covering and protecting the ICs. At least a portion of the mask thickness in the street is patterned with a laser scribing process to provide a patterned mask with gaps or trenches, exposing regions of the substrate between the ICs. The substrate is then plasma etched through the gaps in the patterned mask to singulate the ICs into chips.

In another embodiment, a system for dicing a semiconductor substrate includes a femtosecond laser and a plasma etch chamber, coupled to a same platform. The plasma etch chamber is utilized both for plasma etching of the substrate and for in-situ deposition of a polymeric masking material.

In another embodiment, a method of dicing a substrate having a plurality of ICs includes forming a water soluble mask layer over a front side of a silicon substrate. The water soluble mask layer covers and protects a majority of IC surfaces disposed on the front side of the substrate. The ICs include a copper bumped top surface having bumps surrounded by a passivation layer, such as polyimide (PI). Subsurface thin films below the bumps and passivation include a low-K interlayer dielectric (ILD) layer and a layer of copper interconnect. The water soluble material, the passivation layer, and subsurface thin films are patterned with a femtosecond laser scribing process to expose regions of the silicon substrate between the ICs. The water soluble material thickness is augmented with a polymeric mask material plasma deposited prior to the plasma etch in-situ with the etch chamber that is to perform the substrate etch. The silicon substrate is etched through with a deep silicon plasma etch process to singulate the ICs. The water soluble layer and in-situ deposited polymeric mask materials are then washed off in water or other solvent suitable for removal of etch polymer residue.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
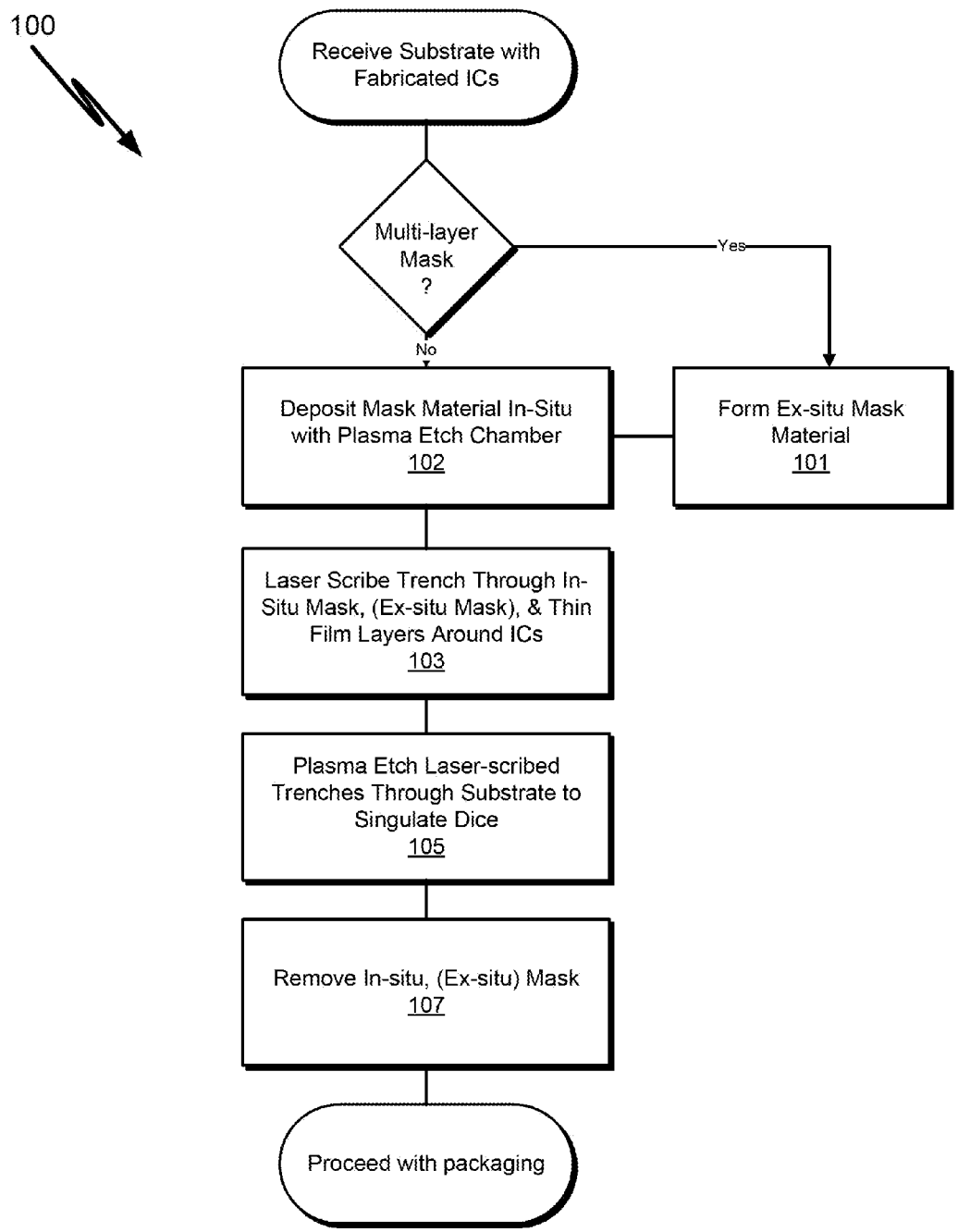
FIG. 1A is a flow diagram illustrating a hybrid laser ablation-plasma etch singulation method with a plasma deposited mask material formed prior to laser scribing, in accordance with an embodiment of the present invention.

Methods of dicing substrates, each substrate having a plurality of ICs thereon, are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, described herein is a hybrid substrate or substrate dicing process involving an initial laser scribe and subsequent plasma etch for die singulation is implemented with an etch mask including a plasma deposited material layer. For certain embodiments where plasma deposition of the mask layer and plasma etching of the substrate for singulation is performed by/occurs within a same plasma chamber, plasma deposition of the mask layer is referred to herein as "in-situ" while mask materials not form by the plasma etch chamber are referred to herein as "ex-situ." The laser scribe process may be used to cleanly remove at least a partial thickness of an unpatterned (i.e., blanket) mask layer, a passivation layer, and subsurface thin film device layers. The laser etch process may then be terminated upon exposure of, or partial ablation of, the substrate. The plasma etch portion of the hybrid dicing process may then be employed to etch through the bulk of the substrate, such as through bulk single crystalline silicon, for singulation or dicing of chips.

In accordance with an embodiment of the present invention, a combination of femtosecond laser scribing and plasma etching is used to dice a semiconductor substrate into individualized or singulated ICs. In one embodiment, femtosecond laser scribing is an essentially, if not completely, non-equilibrium process. For example, the femtosecond-based laser scribing may be localized with a negligible thermal damage zone. In an embodiment, laser scribing is used to singulated ICs having ultra-low κ films (i.e., with a dielectric constant below 3.0). In one embodiment, direct writing with laser eliminates a lithography patterning operation, allowing the masking material to be non-photosensitive, and a plasma etch-based dicing processing implemented with very little cost to partition the substrate. In one embodiment, through silicon via (TSV)-type etching is used to complete the dicing process in a plasma etch chamber; the TSV-type etch depositing on sidewalls of the trench substantially the same material plasma deposited on a topside of the ICs to as the etch mask.

FIG. 1A is a flow diagram illustrating a hybrid laser ablation-plasma etch singulation method with a plasma deposited mask material formed prior to laser scribing, in accordance with an embodiment of the present invention. FIGS. 4A-4D illustrate cross-sectional views of a substrate 406 including first and second ICs 425, 426 corresponding to the operations in method 100, in accordance with an embodiment of the present invention.

Figure 4A:
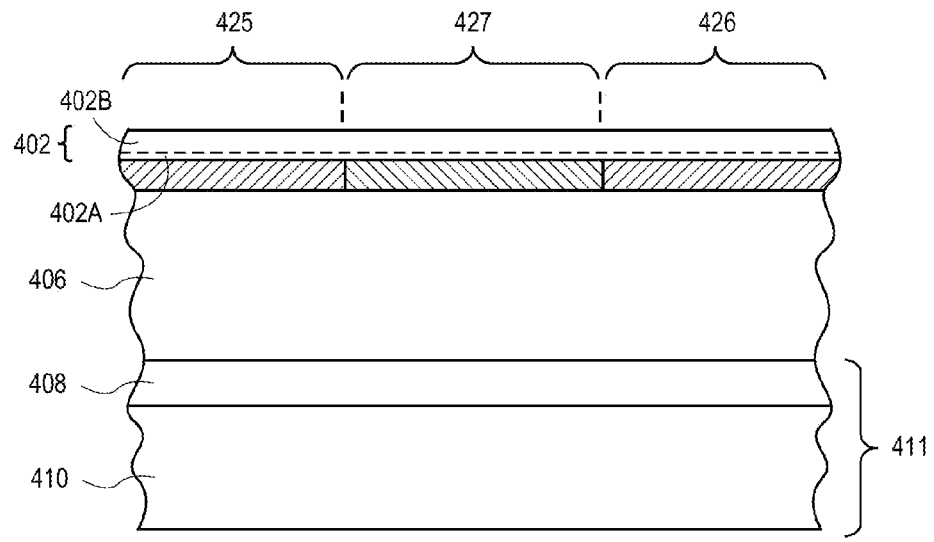
FIG. 4A illustrates a cross-sectional view of a semiconductor substrate including a plurality of ICs corresponding to operation 102 of the dicing method illustrated in FIG. 1A, in accordance with an embodiment of the present invention.

Method 100 begins with receipt of a substrate with ICs formed thereon. Referring to FIG. 4A, substrate 406 is composed of any material suitable to withstand a fabrication process of the thin film device layers formed thereon. For example, in one embodiment, substrate 406 is a group IV-based material such as, but not limited to, monocrystalline silicon, germanium or silicon/germanium. In another embodiment, substrate 406 is a III-V material such as, e.g., a III-V material substrate used in the fabrication of light emitting diodes (LEDs). During device fabrication, the substrate 406 is typically 600 μm-800 μm thick, but as illustrated in FIG. 4A has been thinned to 50 μm to 100 μm with the thinned substrate now supported by a carrier 411, such as a backing tape 410 stretched across a frame (not illustrate) and adhered to a backside of the substrate with a die attach film (DAF) 408.

In embodiments, first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. The width of the street 427 may be anywhere between 10 μm and 100 μm.

At operation 102, a mask 402 including a plasma deposited layer is formed over substrate 406, covering both the ICs 425, 426 and intervening street 427 between the ICs 425, 426. In an embodiment, forming the mask 402 includes plasma depositing a polymer over the substrate. For certain in-situ embodiments, where the plasma etch is to be a deep trench etch process having a plurality of successive etch and deposition cycles, each deposition cycle during the etch operation 105 deposits an additional amount of substantially the same polymer formed during the masking operation 102. However, whereas a typical deep trench etch process is performed with a lithographically defined photo resist mask and does not dynamically accumulate polymer on non-vertical (e.g., horizontal) surfaces during etch, the plasma deposition at operation 102 is to replace a photo resist mask and therefore is performed for a sufficient duration prior to commencement of substrate etching so as to accumulate a polymer protection layer over horizontal surfaces (e.g., top surfaces) of the ICs 425, 426.

Depending on the embodiment, the mask 402 either consists only of the plasma deposited polymer layer formed at operation 102 or, as illustrated by the dashed line in FIG. 4A, the mask 402 includes multiple distinct material layers 402A and 402B, at least one of which is the plasma deposited polymer layer formed at operation 102 while the other is an ex-situ mask material formed at operation 101 (FIG. 1A). For such multi-layered embodiments, the plasma deposited polymer layer may be either in contact with a top surface of the ICs 425, 426 (i.e., deposited polymer layer is 402A) or disposed over an underlying mask material (i.e., deposited polymer layer is 402B). Unlike other more conventional masking materials such as photoresist, inorganic dielectric hardmasks such as silicon dioxide, or silsesquioxanes, a mask including a plasma deposited polymer may be readily removed without damage to an underlying passivation layer, which is often polyimide (PI) and/or bumps, which are often copper. As such, mask 402 is to be of sufficient thickness to survive the plasma etch process (though it may be very nearly consumed), protecting even copper bumps which may be damaged, oxidized, or otherwise contaminated if exposed to the substrate etching plasma.

In one multi-layered mask embodiment where the method 100 includes ex-situ mask formation operation 101, the mask 402 includes a water soluble material disposed over the ICs 425, 426. For such embodiments, the water soluble material may be applied before or after plasma deposition of the polymeric material, to be disposed below or above the plasma deposited polymer layer formed at operation 102, respectively. Therefore, in reference to FIG. 4A, in a first embodiment mask layer 402A is a water soluble material while mask layer 402B is the in-situ plasma deposited polymeric mask material. For such embodiments, presence of the water soluble layer may provide protection a top surface of the ICs 425, 426 during subsequent laser scribing and/or assist with mask the removal process. In a second embodiment, mask layer 402A is the in-situ plasma deposited polymeric mask material while mask layer 402A is a water soluble material.

In an embodiment, the water soluble mask layer is thermally stable to at least 60° C., preferably stable at 100° C., and ideally stable to 120° C. to avoid excessive crosslinking during the subsequent plasma etch process when the material's temperature will be elevated. Generally, excessive crosslinking adversely affects the solubility of the material, making post-etch removal more difficult. Depending on the embodiment, the water soluble layer may be either wet applied or applied as a dry film laminate. For either mode of application, exemplary materials include, at least one of: poly(vinyl alcohol), poly(acrylic acid), poly(methacrylic acid), poly(acrylamide), or poly(ethylene oxide) with many other water soluble materials also readily available. Dry films for lamination may include the water soluble material only or may further include an adhesive layer that may also be water soluble or not. In a particular embodiment, the dry film includes a UV sensitive adhesive layer which has reduced adhesive bond strength upon UV exposure. Such UV exposure may occur during the subsequent plasma street etch.

Figure 2:
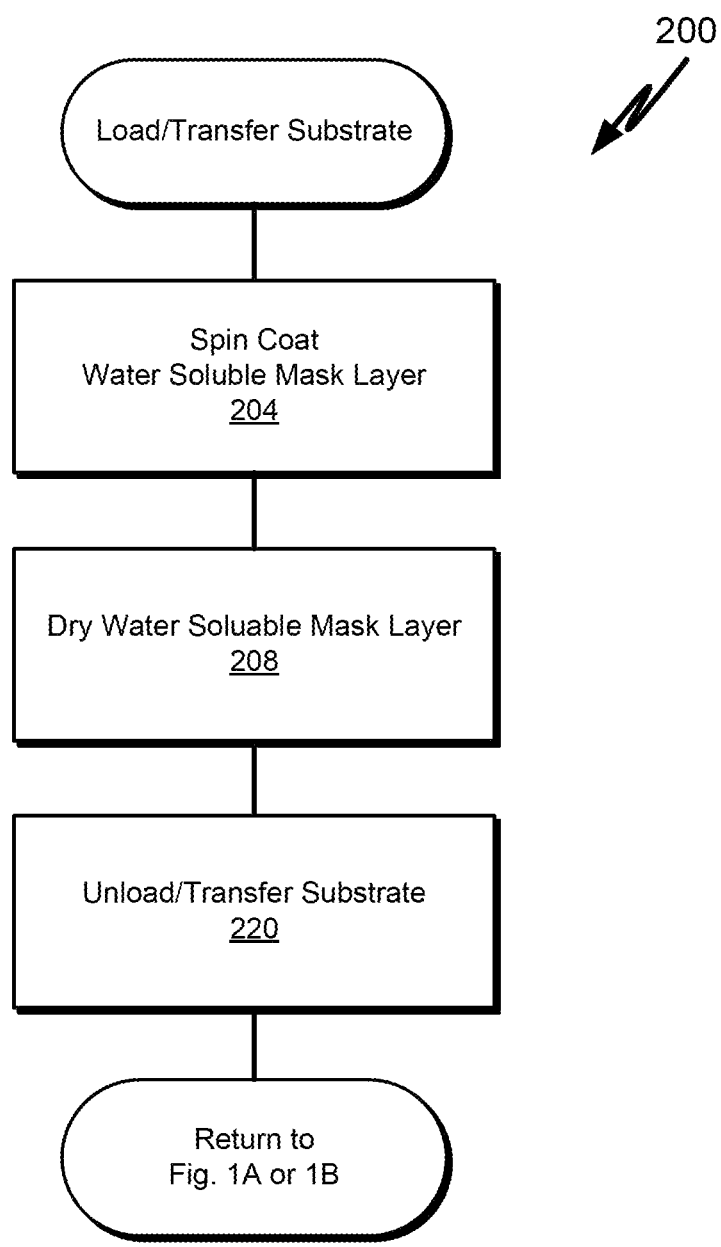
FIG. 2 is a flow diagram illustrating a method of applying a water soluble mask layer as an ex-situ mask, in accordance with an embodiment of the present invention.

FIG. 2 is a flow diagram illustrating a method 200 for spin coating water soluble ex-situ mask layer onto a substrate to be diced which is performed at operation 101, in accordance with an embodiment of the present invention. Method 200 begins with a substrate loaded onto a spin coat system or transferred into a spin coat module of an integrated platform. At operation 204 an aqueous solution of a water soluble polymer is spun over substrate 406. For the present invention, design of the aqueous solution is constrained to a maximum film thickness and thermal stability is a concern. In the street, the maximum thickness of the mask 402, and in particular the water soluble layer, is limited by the ability of a laser to pattern through the masking by ablation. The mask 402 may be much thicker over the ICs 425, 426 and or edges of the street 427 where no street pattern is to be formed by ablation.

Figure 5A:
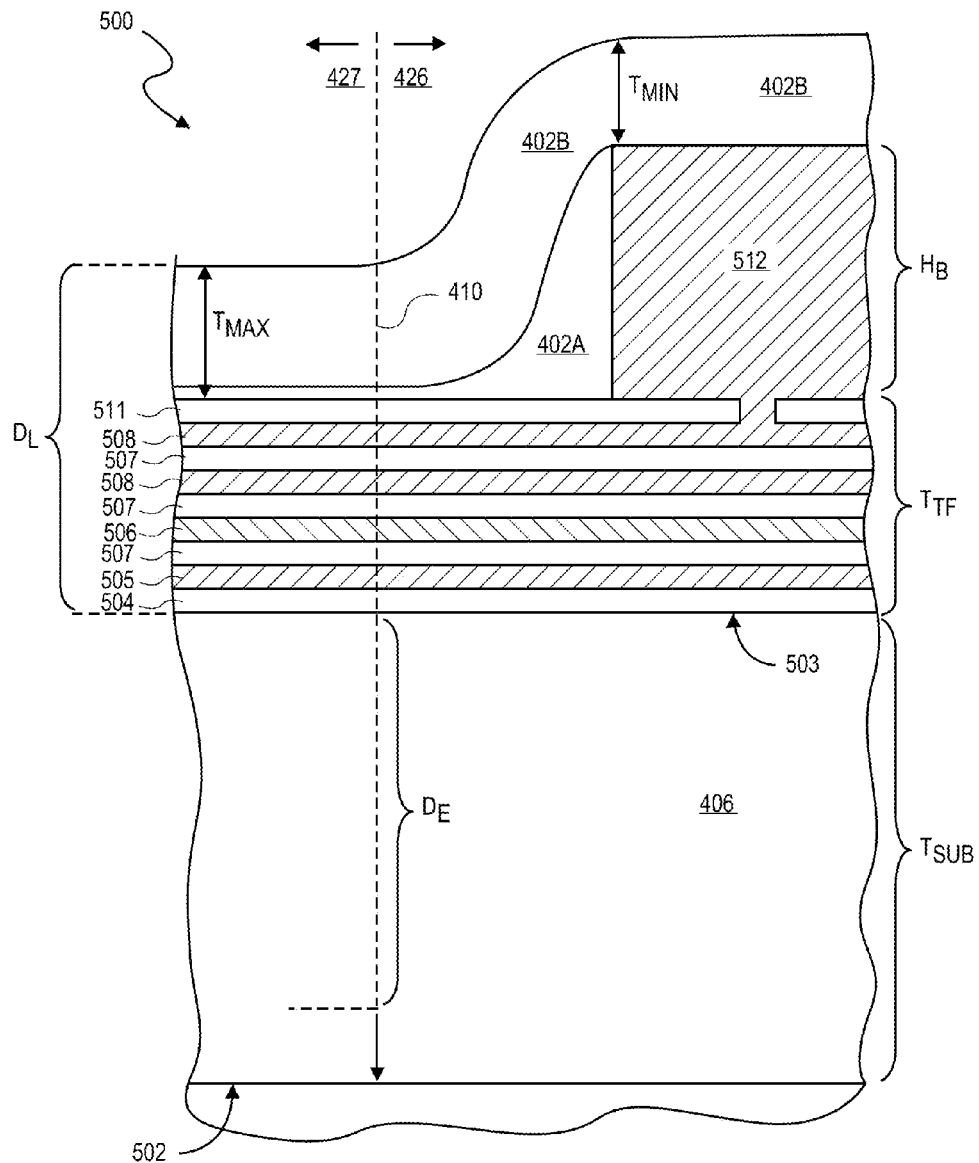
FIG. 5A illustrates a cross-sectional view of plasma deposited polymer mask applied over a water soluble mask prior to laser scribing, in accordance with embodiments of the present invention.

FIG. 5A illustrates an expanded cross-sectional view 500 of plasma deposited polymer mask layer 402B applied over a water soluble mask layer 402A with the water soluble mask layer 402A in contact with a top surface of the IC 426 and the street 427, in accordance with embodiments of the present invention. As shown in FIG. 5A, the substrate 406 has a top surface 503 upon which thin film device layers are disposed which is opposite a bottom surface 502 which interfaces with the DAF 408 (FIG. 4A). Generally, the thin film device layer materials may include, but are not limited to, organic materials (e.g., polymers), metals, or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) such as carbon doped oxide (CDO) disposed there between. A top surface of the IC 426 includes a bump 512, typically copper, surrounded by a passivation layer 511, typically a polyimide (PI) or similar polymer. The bump 512 and passivation layer 511 therefore make up a top surface of the IC with the thin film device layers forming subsurface IC layers. The bump 512 extends from a top surface of the passivation layer 511 by a bump height $H_B$ which in the exemplary embodiments ranges between 10 μm and 50 μm.

The maximum thickness of the mask 402 in the street, $T_{max}$, is generally a function of the laser power and optical conversion efficiency associated with laser wavelength. As $T_{max}$ is associated with the street 427, street feature topography, street width, and the method of applying the water soluble layer may be designed to achieve a desired $T_{max}$. In particular embodiments, the mask 402 has a street thickness $T_{max}$ less than 30 µm and advantageously less than 20 µm with a thicker etch mask calling for multiple laser passes.

The minimum thickness of the mask 402 is a function of the selectivity achieved by the subsequent plasma etch (e.g., operation 105 in FIG. 1). The spin and dispense parameters for the spin coating operation 204 may have only a small process window where $T_{max}$ at the street is maintained below 20 µm while a top surface of the bump (which in an embodiment has a $H_B$ of at least 50 µm) is covered with a minimum mask thickness $T_{min}$, which is a function of the etch selectivity to the water soluble mask material layer. Poly(vinyl alcohol) (PVA), for example, has been found to provide an etch rate of between 1 µm/min and 1.5 µm/min for the exemplary silicon plasma etch processes described elsewhere herein for an etch rate selectivity of approximately 1:20 (PVA: silicon). As such, the minimum thickness over a top bump surface of an IC (e.g., $T_{min}$ in FIG. 5) may be determined by the plasma etch depth $D_E$ which is both a function of the thickness of the substrate $T_{sub}$ and laser scribe depth $D_L$. For example, in the exemplary embodiment where $D_E$ is at least 50 µm, $T_{min}$ is at least 3 µm and would advantageously be at least 6 µm to provide sufficient margin for $D_E$ of at least 100 µm. Such $T_{MIN}$ values may not be consistent with the $T_{MAX}$ constraint.

For embodiments where spin coating of the water soluble layer (FIG. 2, operation 204) to a thickness below $T_{MAX}$ leaves a top surface of a copper bump 512 with a $T_{min}$ mask thickness insufficient to protect the bump 512 through a full duration of the subsequent plasma etching (or even fails to cover the bump 512 at all as illustrated in FIG. 5A), the in-situ plasma deposited polymer mask layer 402B is deposited to a thickness sufficient to achieve the $T_{min}$ necessary to protect the bump 512.

Continuing with the spin coating method 200, at operation 208 the aqueous solution is dried, for example on a hot plate. The drying temperature and time should be selected to avoid excessive crosslinking which may render subsequent mask removal difficult. Exemplary drying temperatures range from 60° C. to 150° C. depending on the material. For example, PVA was found to remain soluble at 60° C. while becoming more insoluble as the temperature approached the 150° C. limit of the range. Completing spin coating method 200, the substrate is unloaded or transferred in-vacuo to a plasma etch chamber for in-situ plasma deposition of the second mask material or to a laser scribe module (returning to method 100 illustrated in FIG. 1A or method 150 illustrated in FIG. 1B, respectively). In particular embodiments, where the water soluble layer is hygroscopic, in-vacuo transfer is particularly advantageous to avoid mask delamination during etch of the substrate.

Returning to FIG. 1A, for embodiments where the mask 402 is to include only a plasma deposited material (operation 101 skipped), or include a second mask material (e.g., a water soluble material layer formed at operation 101), plasma deposition of the polymeric material may proceed in manner known in the art. For one in-situ deposition embodiment, the plasma deposition process at operation 102 proceeds with source gases and plasma conditions substantially the same those employed during a deposition cycle utilized during the subsequent substrate etch process. Exemplary source gases include fluorocarbons, such as, but not limited to, $C_4F_8$ and $C_4F_6$ to deposit a $C_xF_y$ polymer over substrate surfaces. Alternatively, the source gas may be a fluorinated hydrocarbon ($CH_xF_y$) with x and y varying and the exemplary embodiment being $CH_2F_2$ to deposit a $C_xH_yF_z$ polymer over substrate surfaces. Process pressure and plasma power may both vary as a matter of design choice as a function of source gas with higher pressures increasing deposition rates. Exemplary process pressures range between 20 mTorr and 200 mTorr. Plasma power may range between 2 kW and 6 kW source (top) power with typically no bias (bottom) power applied.

As the polymer deposition is performed within an etch chamber, the substrate temperature and more specifically any water soluble layer disposed on the substrate can be maintained at sufficiently low temperatures to retain water solubility of the water soluble material. In the exemplary embodiment, cooling power is applied during plasma deposition of polymer at operation 102 via an electrostatic chuck (ESC) chilled to −10° C. to −15° C. to maintain the water soluble mask material layer at a temperature below 100° C. and preferably between 70° C. and 80° C. throughout the duration of the plasma deposition process.

Generally, the plasma deposited polymer will provide an etch selectivity of between 1:20 and 1:30 (polymer:substrate). In comparison, to achieve similar etch resistance with photoresist for example, a hard bake at a temperature over 150° C. may be necessary and such a high bake temperature would be disadvantageous for embodiments employing a water soluble layer (e.g., causing excessive crosslinking) in contact with the ICs 425, 426. As such, the minimum thickness over a top bump surface of an IC (e.g., $T_{min}$ in FIG. 5) may be determined by the plasma etch depth $D_E$ which is both a function of the thickness of the substrate $T_{sub}$ and laser scribe depth $D_L$. In the exemplary embodiment where $D_E$ is at least 50 µm, $T_{min}$ is at least 2 µm and advantageously at least 4 µm to provide sufficient margin for $D_E$ of at least 100 µm. Depending on the duration of the plasma etch to be performed (i.e., etch depth $D_E$), the masking polymer may be plasma deposited to a thickness ($T_{min}$) of 10 µm, or more. Ideally, the thickness of the plasma deposited polymer is such that it is almost completely consumed during the subsequent substrate etch process, to simplify post-etch mask removal.

Figure 4B:
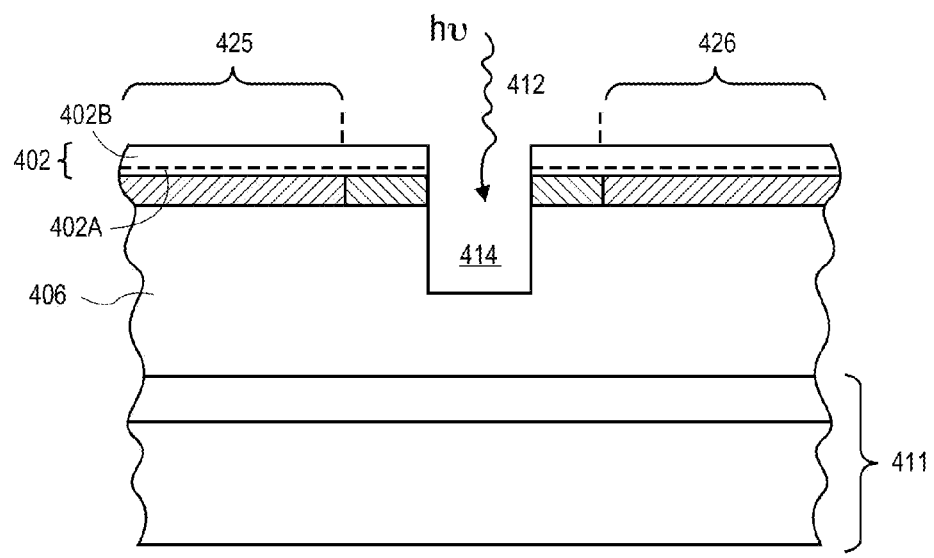
FIG. 4B illustrates a cross-sectional view of a semiconductor substrate including a plurality of ICs corresponding to operation 103 of the dicing method illustrated in FIG. 1A, in accordance with an embodiment of the present invention.

For the method 100, the mask 402, including the plasma deposited layer, is unpatterned prior to the laser scribing operation 103 with the laser scribe to perform a direct writing of the scribe lines by ablating portions of the mask 402 (e.g., water soluble layer 402A and plasma deposited layer 402B) disposed over the street 427. At operation 103 of method 100, and corresponding FIG. 4B, the mask 402 is patterned by ablation with a laser scribing process forming trenches 412, extending the subsurface thin film device layers, and exposing regions of the substrate 406 between the ICs 425, 426. As such, the laser scribing process is used to ablate the thin film material of the streets 427 originally formed between the ICs 425, 426. In accordance with an embodiment of the present invention, patterning the mask 402 with the laser-based scribing process includes forming trenches 414 partially into the regions of the substrate 406 between the ICs 425, 426, as depicted in FIG. 4B.

In the exemplary embodiment illustrated in FIG. 5, the laser scribing depth $D_E$ is approximately in the range of 5 µms to 50 µms deep, advantageously in the range of 10 µms to 20 µms deep, depending on the thickness $T_F$ of the passivation layer 511 and subsurface thin film device layers and thickness $T_{max}$ plasma deposited polymer mask material and any additional material layer included as part of the mask 402 (e.g., water soluble layer).

In an embodiment, the mask 402 is patterned with a laser having a pulse width (duration) in the femtosecond range (i.e., $10^{-15}$ seconds), referred to herein as a femtosecond laser. Laser parameters selection, such as pulse width, may be critical to developing a successful laser scribing and dicing process that minimizes chipping, microcracks and delamination in order to achieve clean laser scribe cuts. A laser pulse width in the femtosecond range advantageously mitigates heat damage issues relative longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond-source. With nanosecond or picoseconds laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in a stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately of 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

Parameters for a femtosecond laser-based process may be selected to have substantially the same ablation characteristics for the inorganic and organic dielectrics, metals, and semiconductors. For example, the absorptivity/absorptance of silicon dioxide is non-linear and may be brought more in-line with that of organic dielectrics, semiconductors and metals. In one embodiment, a high intensity and short pulse width femtosecond-based laser process is used to ablate a stack of thin film layers including a silicon dioxide layer and one or more of an organic dielectric, a semiconductor, or a metal. In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 50 femtoseconds to 500 femtoseconds, although preferably in the range of 100 femtoseconds to 400 femtoseconds.

In certain embodiments, the laser emission spans any combination of the visible spectrum, the ultra-violet (UV), and/or infra-red (IR) spectrums for a broad or narrow band optical emission spectrum. Even for femtosecond laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific embodiment, a femtosecond laser suitable for semiconductor substrate or substrate scribing is based on a laser having a wavelength of approximately of approximately between 1570-200 nanometers although preferably in the range of 540 nanometers to 250 nanometers. In a particular embodiment, pulse widths are less than or equal to 500 femtoseconds for a laser having a wavelength less than or equal to 540 nanometers. However, in an alternative embodiment, dual laser wavelengths (e.g., a combination of an IR laser and a UV laser) are used.

In one embodiment, the laser and associated optical pathway provide a focal spot at the work surface approximately in the range of 3 μm to 15 μm, though advantageously in the range of 5 μm to 10 μm. The spatial beam profile at the work surface may be a single mode (Gaussian) or have a beam shaped top-hat profile. In an embodiment, the laser source has a pulse repetition rate approximately in the range of 200 kHz to 10 MHz, although preferably approximately in the range of 500 kHz to 5 MHz In an embodiment, the laser source delivers pulse energy at the work surface approximately in the range of 0.5 μJ to 100 μJ, although preferably approximately in the range of 1 μJ to 5 μJ. In an embodiment, the laser scribing process runs along a work piece surface at a speed approximately in the range of 300 mm/sec to 5 msec, although preferably approximately in the range of 600 mm/sec to 2 msec.

The scribing process may be run in single pass only, or in multiple passes, but is advantageously no more than two passes. The laser may be applied either in a train of single pulses at a given pulse repetition rate or a train of pulse bursts. In an embodiment, the kerf width of the laser beam generated is approximately in the range of 2 μm to 15 μm, although in silicon substrate scribing/dicing preferably approximately in the range of 6 μm to 10 μm, as measured at a device/silicon interface.

Figure 4C:
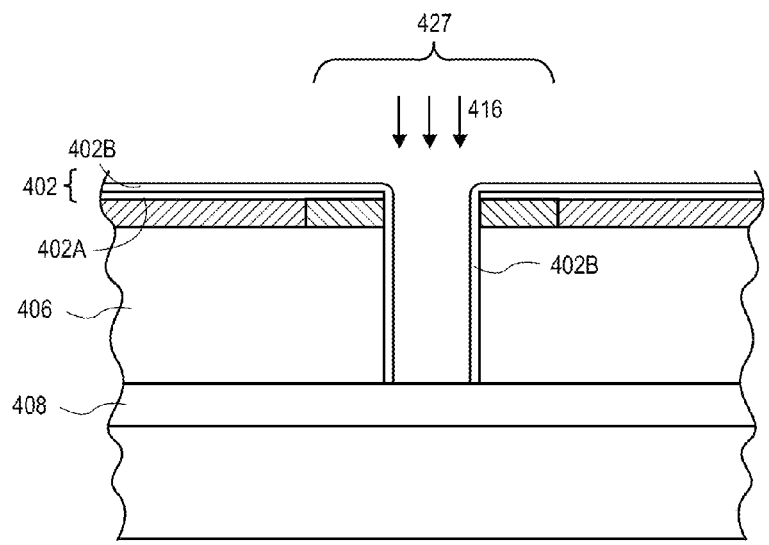
FIG. 4C illustrates a cross-sectional view of a semiconductor substrate including a plurality of ICs corresponding to operation 105 of the dicing method illustrated in FIG. 1A, in accordance with an embodiment of the present invention.
Figure 4D:
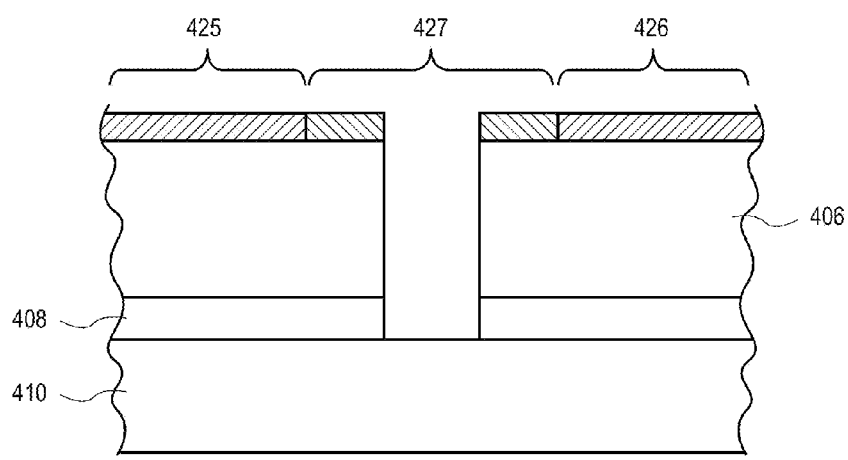
FIG. 4D illustrates a cross-sectional view of a semiconductor substrate including a plurality of ICs corresponding to operation 107 of the dicing method illustrated in FIG. 1A, in accordance with an embodiment of the present invention.

Proceeding with FIGS. 1 and 4C, the substrate 406 is exposed to a plasma 416 to etch through the trenches 412 in the mask 402 to singulate the ICs 426 at operation 105. In the exemplary in-situ mask deposition embodiment, the substrate is etched in the same chamber that performed the plasma mask deposition operation 102. In accordance with an embodiment of the present invention, etching the substrate 406 at operation 105 includes etching the trenches 412 formed with the femtosecond-based laser scribing process to ultimately etch entirely through substrate 406, as depicted in FIG. 4C.

In one embodiment, the etch operation 105 entails a through via etch process. For example, in a specific embodiment, the etch rate of the material of substrate 406 is greater than 25 μms per minute. A high-density plasma source operating at high powers may be used for the plasma etching operation 105. Exemplary powers range between 3 kW and 6 kW, or more.

In an exemplary embodiment, a deep silicon etch (i.e., such as a through silicon via (TSV) etch) is used to etch a single crystalline silicon substrate or substrate 406 at an etch rate greater than approximately 40% of conventional silicon etch rates while maintaining essentially precise profile control and virtually scallop-free sidewalls. Effects of the high power on any water soluble material layer present in the mask 402 are controlled through application of cooling power via an electrostatic chuck (ESC) chilled to −10° C. to −15° C. to maintain the water soluble mask material layer at a temperature below 100° C. and preferably between 70° C. and 80° C. throughout the duration of the plasma etch process. At such temperatures, water solubility is advantageously maintained.

In a specific embodiment, the plasma etch operation 105 further entails a plurality of protective polymer deposition cycles interleaved over time with a plurality of etch cycles. The deposition time to etch time ratio is typically 1:1 to 1:1.4. For example, the etch process may have a deposition cycle with a duration of 250 ms-750 ms and an etch cycle of 250 ms-750 ms. As illustrated in FIG. 4C, with such a deposition to etch time ratio, polymer will accumulate only on vertical surfaces, such as the trench sidewalls while the polymer mask material deposited on horizontal surfaces at operation 102 is consumed or eroded during the substrate etch operation 105. Between the deposition and etch cycles, an etching process chemistry, employing for example $SF_6$ for the exemplary silicon etch embodiment, is alternated with a deposition process chemistry, employing a polymerizing fluorocarbon ($C_xF_y$) gas such as, but not limited to, $C_4F_6$ or $C_4F_8$ or fluorinated hydrocarbon ($CH_xF_y$ with x>1). In one such embodiment, the same polymerizing gas chemistry is the same as that for the masking operation 102. For example, as illustrated in FIG. 4C, where a polymer mask layer 402B is formed on the top horizontal surfaces over an IC at operation 102, the etch operation 105 forms the same polymer mask layer 402B on the sidewalls of the etched trench and also etches away the polymer mask layer 402B (illustrated as being thinner than in FIG. 4A). Process pressures may further be alternated between etch and deposition cycles to favor each in the particular cycle, as known in the art.

At operation 107, method 300 is completed with removal of the mask 402, including the in-situ deposited layer. In an embodiment, a water soluble mask layer is washed off with water, for example with a pressurized jet of de-ionized water or through submergence in an ambient or heated water bath. In alternative embodiments, the mask 402 may be washed off with aqueous solvent solutions known in the art to be effective for etch polymer removal. As further illustrated in FIG. 4D, either of the plasma singulation operation 105 or mask removal process at operation 107 may further pattern the die attach film 908, exposing the top portion of the backing tape 910.

Figure 1B:
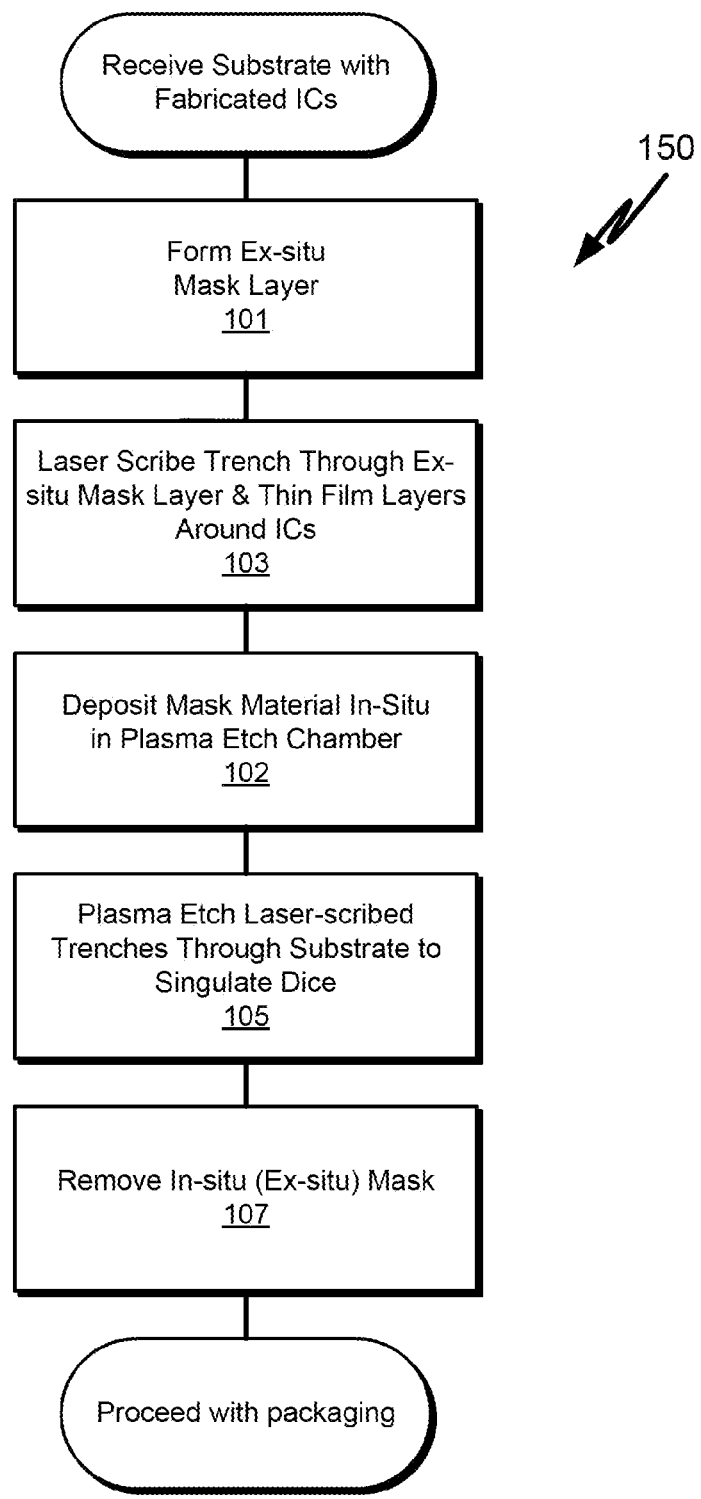
FIG. 1B is a flow diagram illustrating a hybrid laser ablation-plasma etch singulation method with a plasma deposited mask material formed subsequent to laser scribing, in accordance with an embodiment of the present invention.
Figure 5B:
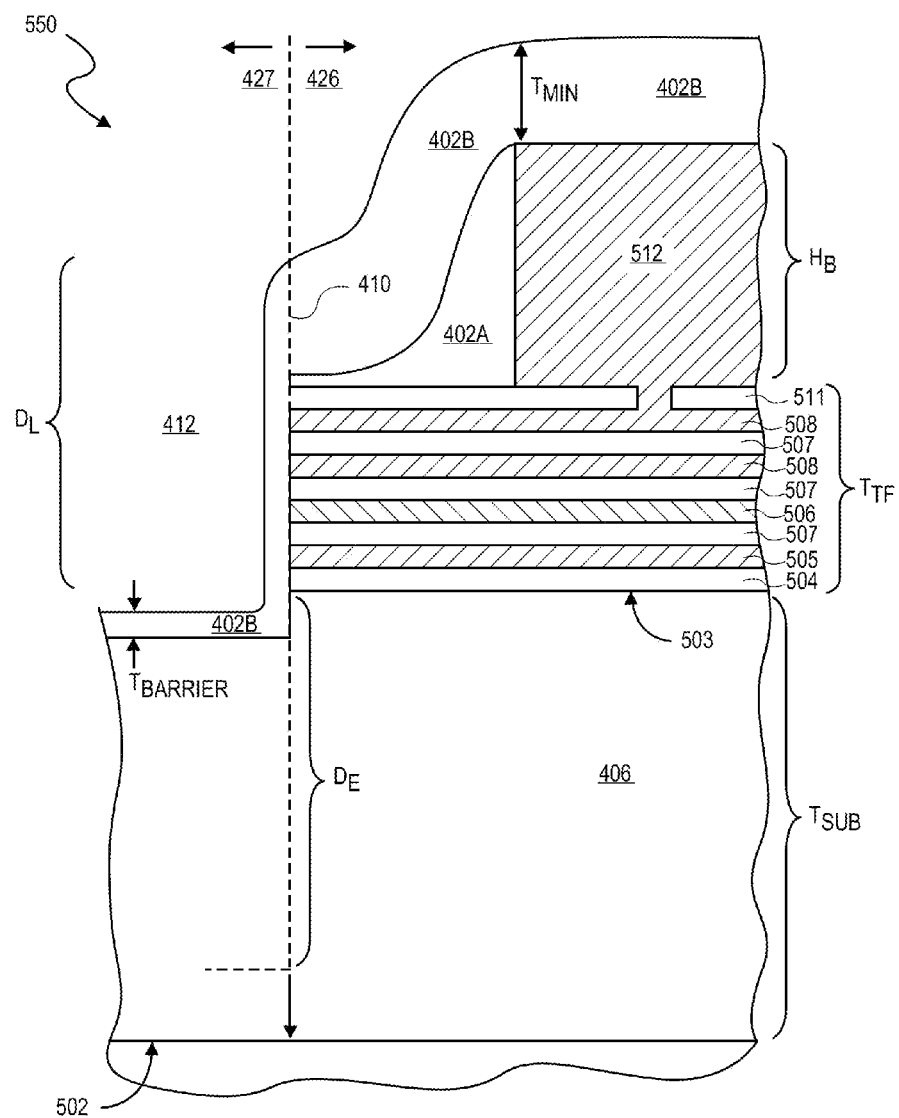
FIG. 5B illustrates a cross-sectional view of a plasma deposited polymer mask applied over a water soluble mask subsequent to laser scribing, in accordance with embodiments of the present invention.

FIG. 1B is a flow diagram illustrating a hybrid laser ablation-plasma etch singulation method 150 with a plasma deposited mask material formed at operation 102 subsequent to the laser scribing operation 103, in accordance with an embodiment of the present invention. FIG. 5B illustrates a cross-sectional view 550 of a plasma deposited polymer mask applied over a water soluble mask subsequent to laser scribing, in accordance with embodiments of the present invention. For embodiments implementing the method 150, the ex-situ mask material layer (e.g., layer 402A in FIG. 5B) is to serve as a contamination protection layer and also a basis for an ablated trench of sufficiently high aspect (AR) that there is a significant differential in the thickness of plasma deposited polymer between a top surface of the IC and the bottom surface of the laser scribed trench exposing the substrate. This differential in plasma deposited polymer then enables a break through etch to clear the deposited polymer from the trench bottom while sufficient deposited polymer remains to mask the ICs.

In the exemplary embodiment illustrated by FIG. 1B, at operation 101, an ex-situ mask (e.g., a water soluble material or any of the materials describe elsewhere herein) is formed by any of the techniques previously described. In a particular embodiment, PVA is spin-coated over the substrate to a thickness of between 2 μm and 12 μm. At operation 103, the ex-situ mask layer is ablated by the laser along with the thin film device layers 504, 505, 506, 507, 508 and 511 in the street 427, as previously described in the context of FIG. 1A.

The aspect ratio (AR) of the scribed trench is laser scribed depth $D_L$ divided by the width of trench 412. For the exemplary embodiments with trench widths between 6 μm to 10 μm, the AR may be anywhere between 1.5:1 and 5:1. Proceeding with FIG. 1B, at operation 102, the substrate is loaded into an etch chamber and an in-situ plasma deposition of polymer is performed substantially as described elsewhere herein. Referring to FIG. 5B, the AR of the scribed trench drives a significant differential in the thickness of plasma deposited polymer at a top surface of the bump 512 ($T_{min}$) and thickness of plasma deposited polymer at the bottom surface of the laser scribed trench 412 ($T_{barrier}$). This differential in plasma deposited polymer ($T_{min}$–$T_{barrier}$) then enables a break through etch to clear the deposited polymer from the trench bottom while sufficient deposited polymer is retained outside of the trench to mask the ICs. In an exemplary embodiment where the plasma deposition operation 102 deposits a $T_{min}$ of 3 μm, $T_{barrier}$ is less than 0.5 μm.

Proceeding with method 150, at operation 105 the substrate is plasma etched (e.g., in the same chamber which performed the mask deposition operation 102) first with a polymer breakthrough to clear the polymer deposited in the scribed trench (without clearing the thicker polymer layer deposited outside of the trench) and second with a substrate etch employing any of the techniques and conditions described elsewhere herein for the method 100. In an embodiment, the polymer breakthrough step entails a higher bias power than utilized during the main etch/dep sequenced anisotropic etch process.

Figure 1C:
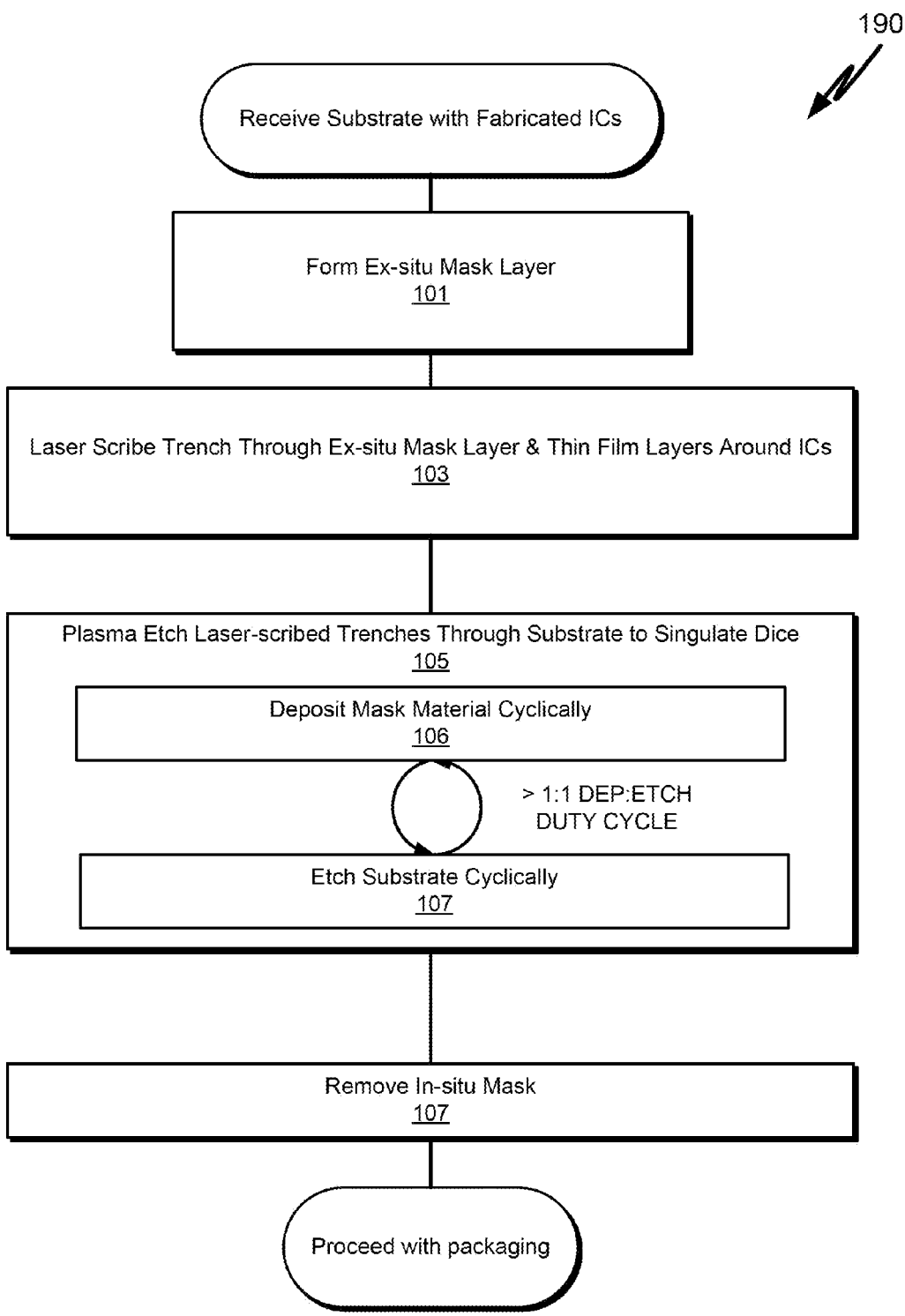
FIG. 1C is a flow diagram illustrating a hybrid laser ablation-plasma etch singulation method with a plasma deposited mask material formed dynamically with etch of the substrate, in accordance with an embodiment of the present invention.

FIG. 1C is a flow diagram illustrating a hybrid laser ablation-plasma etch singulation method 190 having a plasma deposited mask material formed dynamically with etch of the substrate, in accordance with an embodiment of the present invention. At operation 101, an ex-situ mask (e.g., a water soluble material or any of the materials describe elsewhere herein) is formed by any of the techniques previously described. In a particular embodiment, PVA is spin-coated over the substrate to a thickness of between 2 μm and 12 μm. At operation 103, the ex-situ mask is ablated by the laser along with the thin film device layers 504, 505, 506, 507, 508 and 511 in the street 427, as previously described in the context of FIG. 1A.

Proceeding with FIG. 1C, at operation 105, the substrate is loaded into a etch chamber and the substrate is plasma etched. As an alternative to the pre-etch polymer deposition techniques illustrated in FIGS. 1A-1B (e.g., both pre and post laser scribe mask depositions), the polymer mask (e.g., layer 402B in FIG. 4C) is deposited dynamically as the substrate etch proceeds during operation 105. This instaneously in-situ deposited mask may achieve a high aspect trench etch with very high selectivity to the underlying mask layer 402A (e.g., water soluble mask material) at the cost of a slight reduction in substrate etch rate. However, because the substrate need not be taken in and out of the etch chamber multiple times, throughput may still improve relative to the methods 100 and 150.

The substrate etch operation 105 generally employs an iterative or cyclic dep/etch process (e.g., same source gases) similar to those described in the context of the methods 100 and 150. However in one embodiment of method 190, the operation 105 leads off with a deposition cycle (rather than an etch cycle). In a further embodiment, the ratio of deposition time to etch time is relatively higher (e.g., dep time:etch time ratio is greater than 1:1 and more particularly between 1.2:1 and 2:1). For example, in one exemplary embodiment where deposition time is 400-500 ms and etch time is 300 ms, a water soluble mask with only a 2 μm $T_{min}$ over the copper bump 512 may survive an etch with a depth $D_E$ of 100 μm (e.g., 50:1 selectivity). Also, in the cyclic dep/etch process, each etch step is typically partitioned into two sub-steps, with the first sub etch step being directional etch to etch the deposited polymer and silicon on the trench bottom by applying 100-200 W bias power, and the second sub etch step being isotropic etch to etch polymer and silicon isotropically with no bias power being applied. At the fixed time ratio of deposition to etch, the ratio of the first sub etch step time to the second sub etch step time can be also adjusted to better control the consumption of mask layer on top of wafer surface.

It should also be noted that for mask embodiments including a water soluble layer, the spin coating method 200 may be performed prior to, or subsequent to, a backside grind (BSG). As spin coating is generally an accomplished technique for substrates having a conventional thickness of 750 μm, the spin coating method 200 may be advantageously performed prior to backside grind. However, in the alternative, the spin coating method 200 is performed subsequent to the backside grind, for example by supporting both the thin substrate and taped frame upon a rotatable chuck.

Figure 3:
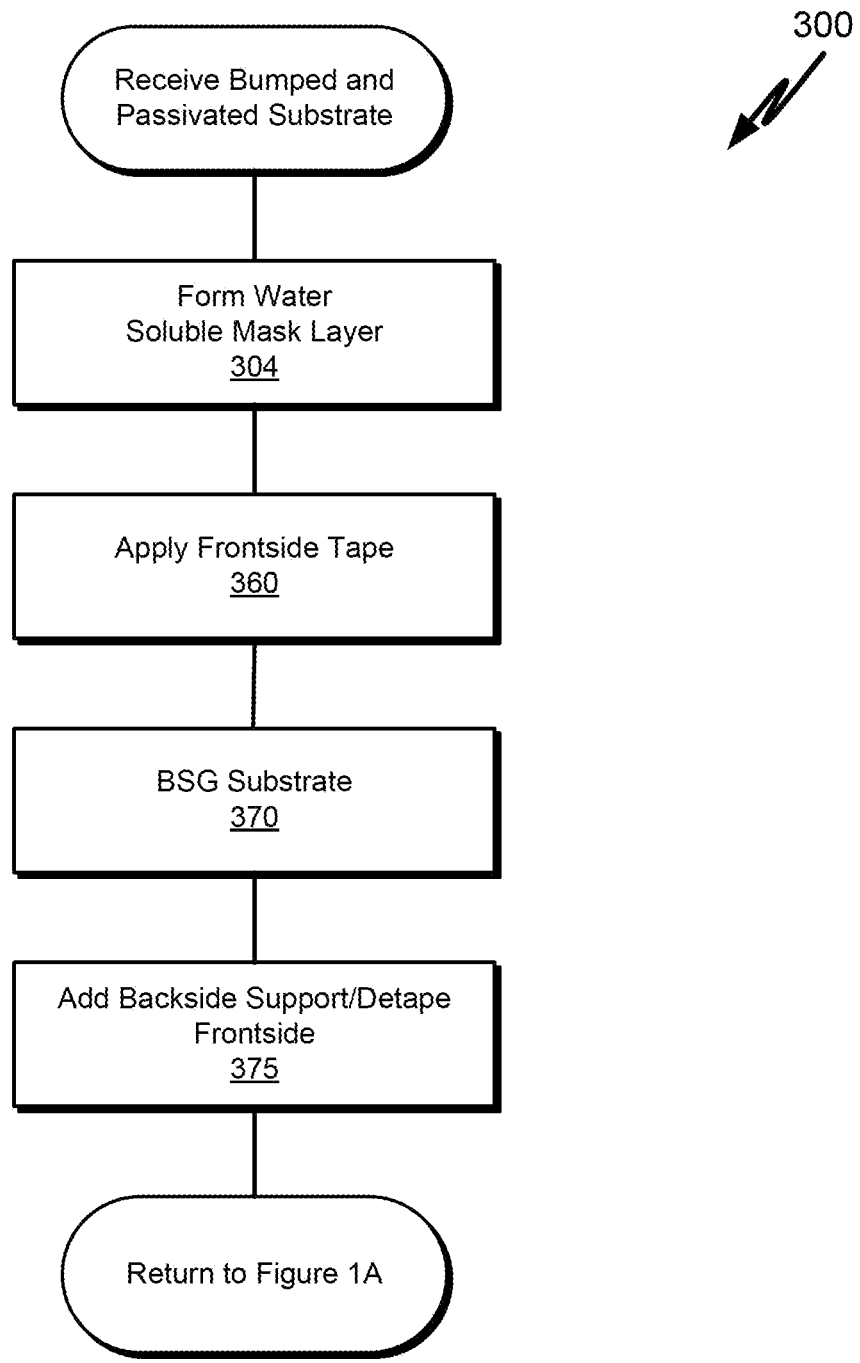
FIG. 3 is a flow diagram illustrating a method of applying a water soluble mask layer to a substrate to be diced prior to wafer thinning, in accordance with an embodiment of the present invention.

FIG. 3 is a flow diagram illustrating a method 300 for applying a water soluble layer to a substrate to be diced prior to wafer thinning. Method 300 begins with receiving a bumped and passivated substrate. At operation 304, the water soluble mask layer (e.g., mask layer 402A) is formed. Operation 304 may therefore entail the spin coating method 200, as described elsewhere herein. At operation 360, frontside tape is formed over the water soluble mask layer. Any conventional frontside tape, such as, but not limited to UV-tape, may be applied over the water soluble mask layer. At operation 370, the substrate is thinned from the backside, for example by grinding the bottom surface 501 of the substrate 406 illustrated in FIG. 5. At operation 375, a backside support 411 is added to the thinned substrate. For example, the backside tape 410 may be applied and the frontside tape then removed to expose the water soluble mask layer. Method 300 then returns to operation 103 (FIG. 1) to complete method 100, in accordance with an embodiment of the present invention.

Figure 6:
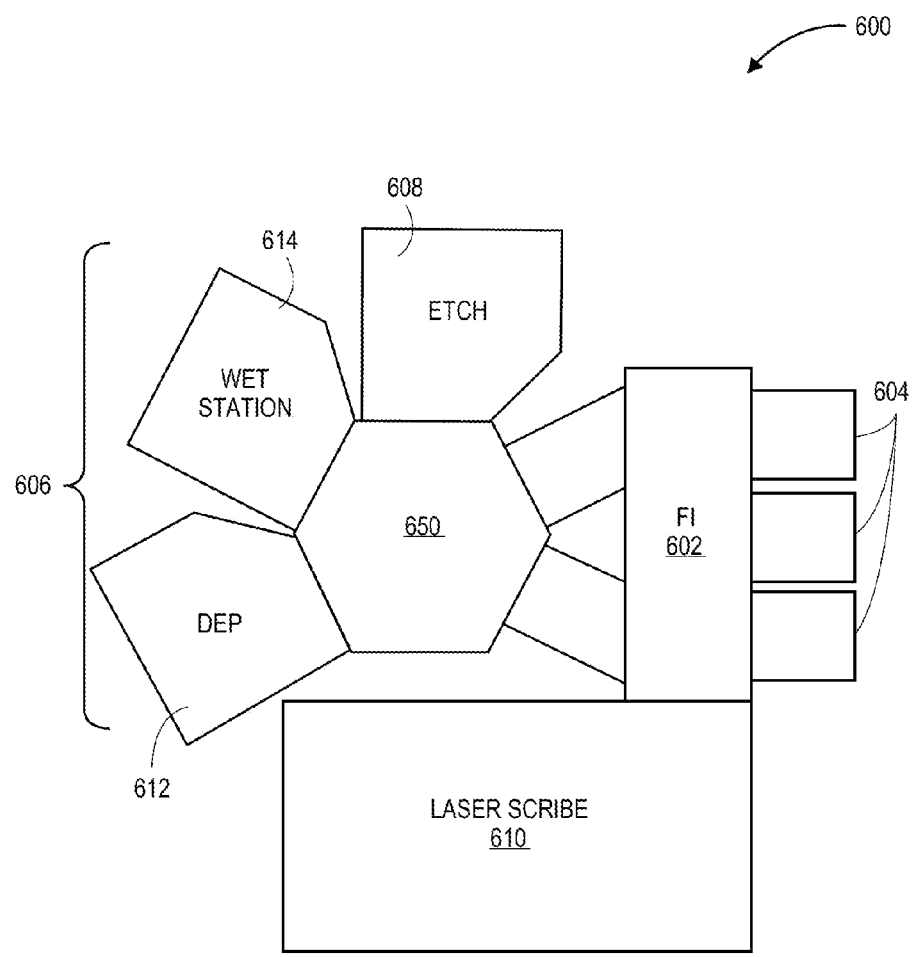
FIG. 6 illustrates a block diagram of an integrated platform layout for laser and plasma dicing of substrates with an integrated wet station for mask removal, in accordance with an embodiment of the present invention.

A single process tool 600 may be configured to perform many or all of the operations in the hybrid laser ablation-plasma etch singulation process 100. For example, FIG. 6 illustrates a block diagram of a cluster tool 606 coupled with laser scribe apparatus 610 for laser and plasma dicing of substrates, in accordance with an embodiment of the present invention. Referring to FIG. 6, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either cluster tool 606 or laser scribe apparatus 610, or both.

A laser scribe apparatus 610 is also coupled to the FI 602. In an embodiment, the laser scribe apparatus 610 includes a femtosecond laser. The femtosecond laser to performing the laser ablation portion of the hybrid laser and etch singulation process 100. In one embodiment, a moveable stage is also included in laser scribe apparatus 610, the moveable stage configured for moving a substrate or substrate (or a carrier thereof) relative to the femtosecond-based laser. In a specific embodiment, the femtosecond laser is also moveable.

The cluster tool 606 includes one or more plasma etch chambers 608 coupled to the FI by a robotic transfer chamber 650 housing a robotic arm for in-vacuo transfer of substrates. The plasma etch chambers 608 is suitable for both the plasma etch portion of the hybrid laser and etch singulation process 100 and to deposit a polymer mask over the substrate. In one exemplary embodiment, the plasma etch chamber 608 is further coupled to an $SF_6$ gas source and at least one of a $C_4F_8$, $C_4F_6$, or $CH_2F_2$ source. In a specific embodiment, the one or more plasma etch chambers 608 is an Applied Centura® Silvia™ Etch system, available from Applied Materials of Sunnyvale, Calif., USA, although other suitable etch systems are also available commercially. In an embodiment, more than one plasma etch chamber 608 is included in the cluster tool 606 portion of integrated platform 600 to enable high manufacturing throughput of the singulation or dicing process.

The cluster tool 606 may include other chambers suitable for performing functions in the hybrid laser ablation-plasma etch singulation process 100. In the exemplary embodiment illustrated in FIG. 6, a wet process module 614 is coupled to the robotic transfer module 650 to wash off a remainder of a water soluble mask and/or plasma deposited polymer after plasma etching the substrate. The wet process module 614 may include for example a pressurized water spray jet or other solvent dispenser.

In still other embodiments, the deposition module 612 is a spin coating module for application of the water soluble mask layer described herein. As a spin coating module, the deposition module 612 may include a rotatable chuck adapted to clamp by vacuum, or otherwise, a thinned substrate mounted on a carrier such as backing tape mounted on a frame.

Figure 7:
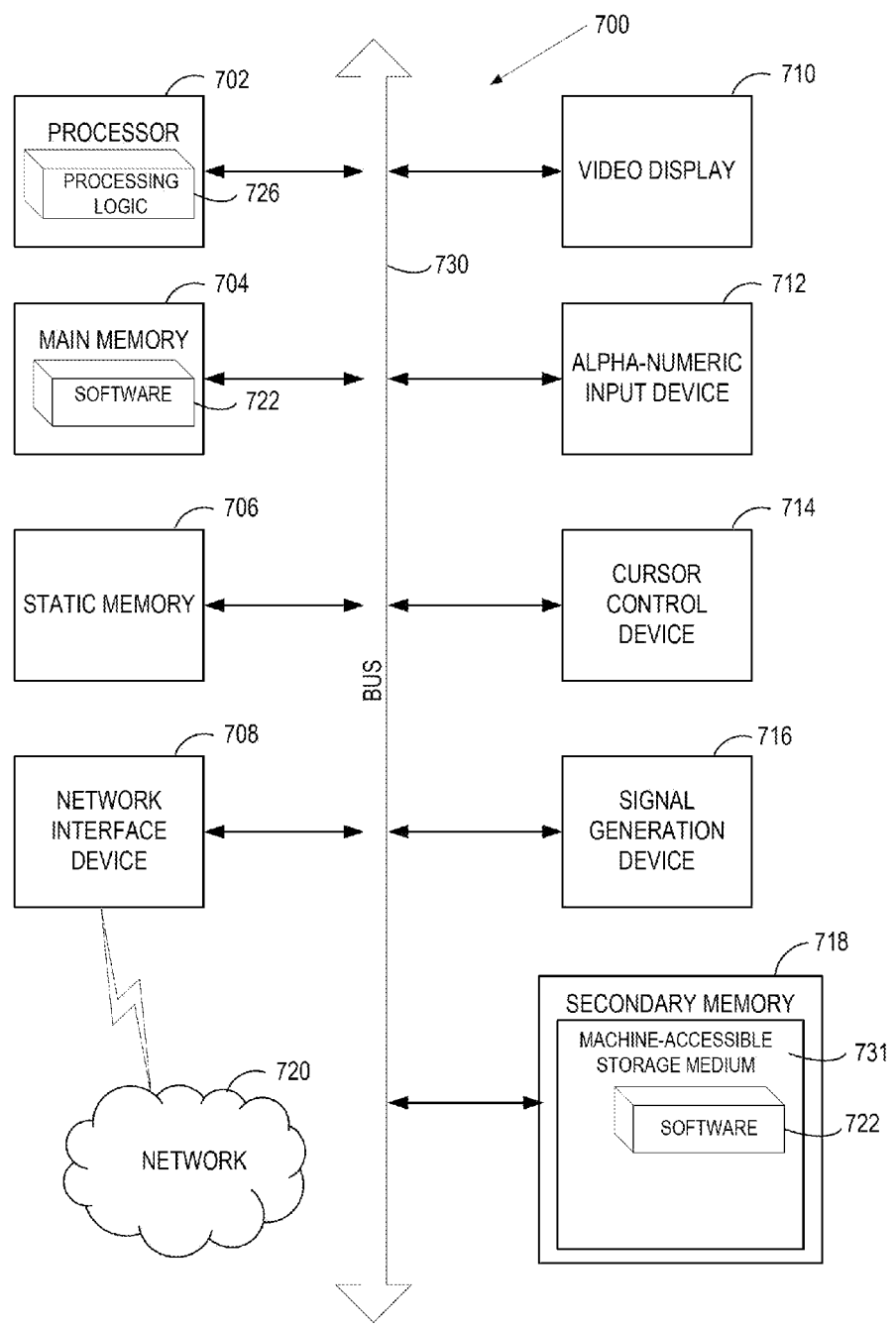
FIG. 7 illustrates a block diagram of an exemplary computer system which controls automated performance of one or more operation in the masking, laser scribing, plasma dicing methods described herein, in accordance with an embodiment of the present invention.

FIG. 7 illustrates a computer system 700 within which a set of instructions, for causing the machine to execute one or more of the scribing methods discussed herein may be executed, for example to analyze a reflected light from a tag to identify at least one micromachine artifact. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

The machine-accessible storage medium 731 may also be used to store pattern recognition algorithms, artifact shape data, artifact positional data, or particle sparkle data. While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A method of dicing a substrate comprising a plurality of ICs, the method comprising:
   forming a mask, over the substrate covering and protecting the ICs;
   patterning at least a portion of the mask thickness with a laser scribing process to provide a patterned mask with trenches, exposing regions of the substrate between the ICs; and
   plasma etching the substrate through the trenches in the patterned mask to singulate the ICs, wherein forming the mask further comprises plasma depositing a polymer over the substrate, wherein forming the mask further comprises applying a second mask material layer by spin coating the second mask material prior to plasma depositing the layer of polymer, the spin coating of the second mask material layer leaving a top surface of a copper bump on the IC with a mask thickness insufficient to protect the bump through the full duration of the plasma etching, wherein the second mask material layer is a water soluble polymer, wherein patterning at least a portion of the mask with a laser scribing process further comprises ablating the second mask material to form the trenches, and wherein etching the semiconductor substrate comprises etching the trenches with an etch process during which the water soluble polymer mask material layer is maintained below 100° C.

2. The method of claim 1, wherein the plasma etching further comprises a deep trench etch process including a plurality of successive etch and deposition cycles, each deposition cycle depositing an additional amount of the polymer.

3. The method of claim 2, wherein plasma depositing the mask layer and plasma etching the substrate is performed by a same plasma chamber.

4. The method of claim 1, wherein plasma depositing the masking layer further comprises building up a layer of the polymer over a top surface of a copper bump on the IC.

5. The method of claim 4, wherein plasma depositing the layer of polymer further comprises, exposing the substrate to a plasma of a source gas comprising at least one of $C_4F_8$, $C_4F_6$, or $CH_2F_2$.

6. The method of claim 5, wherein plasma depositing the layer of polymer further comprises depositing the layer to a thickness of at least 1 micron.

7. The method of claim 1, wherein forming a second mask material further comprises forming at least one of: poly(vinyl alcohol), poly(acrylic acid), poly(methacrylic acid), poly(acrylamide), or poly(ethylene oxide) in contact with the top surface of a passivation layer of the ICs.

8. The method of claim 1, wherein patterning at least a portion of the mask with a laser scribing process comprises ablating a trench into the second mask material and wherein the plasma depositing of the layer of polymer is performed subsequent to ablating the trench into the second mask material.

9. The method of claim 8, wherein the plasma etching further comprises a breakthrough etch sufficient to clear a layer of plasma deposited polymer formed within the trench in ablated into the second mask material, the breakthrough etch insufficient to clear a layer of plasma deposited polymer formed outside of the trench.

10. The method of claim 1, wherein patterning the mask with the femtosecond laser scribing process comprises using a laser having a wavelength less than or equal to 540 nanometers and a laser pulse width less than or equal to 400 femtoseconds.

11. The method of claim 1, further comprising removing the mask after plasma etching the substrate with an aqueous solution.

12. A method of dicing a semiconductor substrate comprising a plurality of ICs, the method comprising:
   forming a water soluble material layer over a silicon substrate, the water soluble material layer covering a region of the substrate to be removed by the dicing;
   plasma depositing a polymer different from the water soluble material layer over the silicon substrate, the plasma deposited polymer covering a copper bump on an IC;
   patterning the water soluble material layer with a femtosecond laser to expose regions of the silicon substrate between the ICs; and
   etching the exposed regions of the silicon substrate to singulate the ICs.

13. The method of claim 12, wherein plasma depositing the polymer layer comprises exposing the substrate to a plasma of a source gas comprising at least one of $C_4F_8$, $C_4F_6$, or $CH_2F_2$ and wherein etching the silicon substrate comprises exposing the substrate to a plurality of successive etch and deposition cycles, each deposition cycle exposing the substrate to a plasma of a source gas comprising at least one of $C_4F_8$, $C_4F_6$, or $CH_2F_2$.

14. A method of dicing a substrate comprising a plurality of ICs, the method comprising:
   forming a mask, over the substrate covering and protecting the ICs;
   patterning at least a portion of the mask thickness with a laser scribing process to provide a patterned mask with trenches, exposing regions of the substrate between the ICs; and
   plasma etching the substrate through the trenches in the patterned mask to singulate the ICs, wherein forming the mask further comprises plasma depositing a polymer over the substrate, wherein forming the mask further comprises applying a second mask material layer by spin coating the second mask material subsequent to plasma depositing the layer of polymer, the spin coating of the second mask material layer providing a second mask material layer thickness disposed over a top surface of a copper bump on an IC that is insufficient to protect the underlying deposited layer of polymer through the full duration of the plasma etching absent the plasma deposited layer of polymer, wherein the second mask material layer is a water soluble polymer, wherein patterning at least a portion of the mask with a laser scribing process further comprises ablating the second mask material to form the trenches, and wherein etching the semiconductor substrate comprises etching the trenches with an etch process during which the water soluble polymer mask material layer is maintained below 100° C.

15. The method of claim 14, wherein the plasma etching further comprises a deep trench etch process including a plurality of successive etch and deposition cycles, each deposition cycle depositing an additional amount of the polymer.

16. The method of claim 15, wherein plasma depositing the mask layer and plasma etching the substrate is performed by a same plasma chamber.

17. The method of claim 14, wherein plasma depositing the masking layer further comprises building up a layer of the polymer over a top surface of a copper bump on the IC.

18. The method of claim 17, wherein plasma depositing the layer of polymer further comprises, exposing the substrate to a plasma of a source gas comprising at least one of $C_4F_8$, $C_4F_6$, or $CH_2F_2$.

19. The method of claim 18, wherein plasma depositing the layer of polymer further comprises depositing the layer to a thickness of at least 1 micron.

20. The method of claim 14, wherein forming a second mask material further comprises forming at least one of: poly(vinyl alcohol), poly(acrylic acid), poly(methacrylic acid), poly(acrylamide), or poly(ethylene oxide).

21. The method of claim 14, wherein both the spin coating and plasma depositing are prior to the patterning of at least a portion of the mask with a laser scribing process.

22. The method of claim 14, wherein patterning the mask with the femtosecond laser scribing process comprises using a laser having a wavelength less than or equal to 540 nanometers and a laser pulse width less than or equal to 400 femtoseconds.

23. The method of claim 14, further comprising removing the mask after plasma etching the substrate with an aqueous solution.

24. A method of dicing a substrate comprising a plurality of ICs, the method comprising:
    forming a mask over the substrate covering and protecting the ICs;
    patterning at least a portion of the mask thickness with a laser scribing process to provide a patterned mask with trenches, exposing regions of the substrate between the ICs; and
    plasma etching the substrate through the trenches in the patterned mask to singulate the ICs, wherein forming the mask comprises spin coating a first mask material and, subsequently, plasma depositing a layer of polymer as a second mask material, the spin coating of the first mask material layer leaving a top surface of a copper bump on the IC with a mask thickness insufficient to protect the bump through the full duration of the plasma etching.

25. The method of claim 24, wherein the plasma etching further comprises a deep trench etch process including a plurality of successive etch and deposition cycles, each deposition cycle depositing an additional amount of the polymer.

26. The method of claim 24, wherein plasma depositing the layer of polymer comprises exposing the substrate to a plasma of a source gas comprising at least one of $C_4F_8$, $C_4F_6$, or $CH_2F_2$.

27. The method of claim 24, wherein plasma depositing the layer of polymer comprises depositing the layer to a thickness of at least 1 micron.

28. The method of claim 24, wherein forming a first mask material comprises forming at least one of: poly(vinyl alcohol), poly(acrylic acid), poly(methacrylic acid), poly(acrylamide), or poly(ethylene oxide) in contact with the top surface of a passivation layer of the ICs.

29. The method of claim 24, further comprising removing the mask after plasma etching the substrate with an aqueous solution.

* * * * *

UNITED STATES PATENT AND TRADEMARK OFFICE
CERTIFICATE OF CORRECTION

PATENT NO.       : 8,598,016 B2                          Page 1 of 1
APPLICATION NO.  : 13/160973
DATED            : December 3, 2013
INVENTOR(S)      : Madhava Rao Yalamanchili et al.

It is certified that error appears in the above-identified patent and that said Letters Patent is hereby corrected as shown below:

In the Claims

Col. 16, Line 18 delete "in".

Signed and Sealed this
Thirteenth Day of May, 2014

Michelle K. Lee
*Deputy Director of the United States Patent and Trademark Office*